US009662882B2

(12) United States Patent
Hirai et al.

(10) Patent No.: US 9,662,882 B2
(45) Date of Patent: *May 30, 2017

(54) LIQUID EJECTING HEAD AND LIQUID EJECTING APPARATUS

(71) Applicant: SEIKO EPSON CORPORATION, Tokyo (JP)

(72) Inventors: Eiju Hirai, Minowa-machi (JP); Shiro Yazaki, Chino (JP); Motoki Takabe, Shiojiri (JP); Yuma Fukuzawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/098,849

(22) Filed: Apr. 14, 2016

(65) Prior Publication Data

US 2016/0229182 A1  Aug. 11, 2016

Related U.S. Application Data

(63) Continuation of application No. 14/833,942, filed on Aug. 24, 2015, now Pat. No. 9,340,019, which is a (Continued)

(30) Foreign Application Priority Data

Feb. 12, 2014  (JP) .................................. 2014-024066

(51) Int. Cl.
*B41J 2/045*  (2006.01)
*B41J 2/14*  (2006.01)
(Continued)

(52) U.S. Cl.
CPC ....... *B41J 2/14274* (2013.01); *B41J 2/14201* (2013.01); *B41J 2/14233* (2013.01);
(Continued)

(58) Field of Classification Search
CPC .... B41J 2/14201; B41J 2/14233; B41J 2/274; B41J 2/161; B41J 2/1612
See application file for complete search history.

(56) References Cited

U.S. PATENT DOCUMENTS 8,201,926 B2 * 6/2012 Shimada .............. B41J 2/14233
   347/58
9,132,637 B2   9/2015 Hirai et al.
(Continued)

FOREIGN PATENT DOCUMENTS

JP   09-286104   11/1997
JP   11-320878   11/1999
(Continued)

OTHER PUBLICATIONS

U.S. Appl. No. 14/833,942, filed Aug. 24, 2015, Hirai et al.
U.S. Appl. No. 14/603,939, filed Jan. 23, 2015, Hirai et al.

*Primary Examiner* — Juanita D Jackson
(74) *Attorney, Agent, or Firm* — Workman Nydegger (57) ABSTRACT

At an area corresponding to a pressure chamber, the width of a lower electrode film in a nozzle row direction is narrower than the width of the pressure chamber in the same direction. A vibrating plate at the area corresponding to a pressure chamber includes an area P1, an area P2, and an area P3. The area P1 is an area on which the piezoelectric layer to be an activation portion is stacked. The area P2 is an area on which the piezoelectric layer to be an inactivation portion is stacked. The area P3 is an area on which the piezoelectric layer is not stacked. When the thicknesses of the vibrating plate at the areas P1, P2 and P3 are set to, respectively, t1, t2, and t3, the following expression is satisfied: $t1 > t2 \geq t3$ (1).

30 Claims, 7 Drawing Sheets

Related U.S. Application Data continuation of application No. 14/603,939, filed on Jan. 23, 2015, now Pat. No. 9,132,637.

(51) Int. Cl.
  *B41J 2/16* (2006.01)
  *H01L 41/047* (2006.01)

(52) U.S. Cl.
  CPC .......... *B41J 2/1612* (2013.01); *H01L 41/047* (2013.01); *B41J 2002/14491* (2013.01); *B41J 2202/11* (2013.01)

(56) References Cited

U.S. PATENT DOCUMENTS

| | | | |
|---|---|---|---|
| 9,340,019 B2* | 5/2016 | Hirai | ................ B41J 2/1612 |
| 2005/0068377 A1 | 3/2005 | Ishikawa et al. | |
| 2008/0199598 A1 | 8/2008 | Sugahara | |
| 2009/0053402 A1 | 2/2009 | Sekiguchi et al. | |
| 2009/0284568 A1 | 11/2009 | Yazaki | |
| 2014/0118446 A1 | 5/2014 | Izumi et al. | |
| 2015/0360469 A1 | 12/2015 | Hirai et al. | |

FOREIGN PATENT DOCUMENTS

| | | |
|---|---|---|
| JP | 2000-071449 | 3/2000 |
| JP | 2005-119271 | 5/2005 |
| JP | 2008-198960 | 8/2008 |
| JP | 2009-172878 | 8/2009 |
| JP | 2010-208071 | 9/2010 |

\* cited by examiner

LIQUID EJECTING HEAD AND LIQUID EJECTING APPARATUS

CROSS-REFERENCE TO RELATED APPLICATIONS

This application is a continuation of U.S. patent application Ser. No. 14/833,942, filed Aug. 24, 2015, now U.S. Pat. No. 9,340,019, which is a Continuation of U.S. patent application Ser. No. 14/603,939 filed on Jan. 23, 2015, now U.S. Pat. No. 9,132,637 issued Sep. 15, 2015, which claims priority to Japanese Patent Application No. 2014-024066 filed on Feb. 12, 2014, which applications are hereby incorporated by reference in their entirety.

BACKGROUND

1. Technical Field

Embodiments of the present invention relate to a liquid ejecting head that ejects liquid by driving a piezoelectric element and to a liquid ejecting apparatus that includes the liquid ejecting head.

2. Related Art

A liquid ejecting apparatus is an apparatus that includes a liquid ejecting head. For example, an ink jet printer and an ink jet plotter are examples of the liquid ejecting apparatus. Various types of liquid can be ejected from the liquid ejecting head.

Recently, the liquid ejecting apparatus has been also applied to or included in various manufacturing apparatuses because of the liquid ejecting apparatus has the advantage of being able to accurately impact or deposit very small amounts of liquid at a predetermined position. The liquid ejecting apparatus has been applied to or included in, for example, a display manufacturing apparatus, an electrode forming apparatus, and a chip manufacturing apparatus. The display manufacturing apparatus manufactures a color filter used in a liquid crystal display and the like. The electrode forming apparatus forms an electrode used in an organic Electro Luminescence (EL) display, a field emission display (FED), and the like. The chip manufacturing apparatus manufactures a biochip (biochemical element). Liquid type ink drops are ejected from a recording head for an image recording apparatus. A solution is ejected from a coloring material ejecting head for the display manufacturing apparatus. The solution contains a red (R) coloring material, a green (G) coloring material, and a blue (B) coloring material. Liquid type electrode material drops are ejected from an electrode material ejecting head for the electrode forming apparatus. A biological organic material solution is ejected from a biological organic material ejecting head for the chip manufacturing apparatus.

The liquid ejecting head is configured to introduce a liquid into a pressure chamber, and generate a pressure fluctuation in the liquid in the pressure chamber, so that the liquid may be ejected from a nozzle linked to the pressure chamber. A pressure generator causes the pressure fluctuation to occur in the liquid in the pressure chamber. A piezoelectric element is appropriately used as the pressure generator. The piezoelectric element is configured, for example, in such a manner that a lower electrode film, a piezoelectric layer, and an upper electrode film are respectively stacked and formed in order from a side near the pressure chamber using a film forming technology. The lower electrode film functions as an individual electrode provided in or for each pressure chamber. The piezoelectric layer is formed of lead zirconate titanate (PZT) and the like. The upper electrode film functions as or is formed as a common electrode which is common to a plurality of pressure chambers (for example JP-A-2009-172878). A portion of the piezoelectric film interposed between the upper electrode film and the lower electrode film is set to be an activation portion (active portion) that is deformed by applying a voltage to the electrode films. Such a piezoelectric element is formed on a vibrating plate which sub-divides the pressure chamber on one side (for example, a side opposite to a nozzle plate in which the nozzle is formed). The vibrating plate has flexibility and is deformed depending on or according to the deformation of the piezoelectric element.

If a piezoelectric element formed with a film shape is too thin, the piezoelectric element may be bended too much in a state where a driving voltage is not applied to an electrode film (an initial state). This may have an impact on the ability of effectively eject liquid from the pressure chamber. Thus, it is necessary to consider that such a piezoelectric element is suppressed from excessively bending, that a neutral axis of the piezoelectric element is held at an appropriate position and that a vibrating plate may be thick. With such a structure, it is possible to make the piezoelectric element have rigidity in an activation portion (active portion) and to suppress the piezoelectric element from excessively bending in the initial state. However, if the vibrating plate is thick, a portion on which a piezoelectric layer is not stacked in an area corresponding to a pressure chamber has an excessive thickness. In this case, deformation of the vibrating plate is prevented at the portion corresponding to the pressure chamber on which the piezoelectric layer is not stacked. Accordingly, the pressure fluctuation may be insufficiently transferred to liquid in the pressure chamber.

SUMMARY

An advantage of some aspects of the invention is to provide a liquid ejecting head and a liquid ejecting apparatus that are capable of suppressing a piezoelectric layer from excessively bending without deformation of a vibrating plate being prevented. Embodiments of the invention ensure that the vibrating plate is sufficiently deformed when generating a pressure fluctuation in a pressure chamber even when the vibrating plate is thick and the piezoelectric layer is thin.

According to an embodiment of the invention, a liquid ejecting head includes a pressure chamber formation substrate in which a plurality of spaces are formed in a first direction. The spaces that communicate with a nozzle may be pressure chambers. A vibrating plate may be formed on one side of the pressure chamber formation substrate and may seal the one side of the pressure chambers formed in the pressure chamber formation substrate. The liquid ejecting head also includes a piezoelectric element obtained by stacking a first electrode layer, a piezoelectric layer, and a second electrode layer in order from a vibrating plate side on the vibrating plate. The vibrating plate blocks an opening of the space in the pressure chamber formation substrate to sub-divide the pressure chamber. The first electrode layer is provided independently for each pressure chamber and the second electrode layer is provided continuously through or for the plurality of pressure chambers. The first electrode layer is formed to have a width in the first direction that is narrower than a width of the pressure chamber in the first direction at an area corresponding to the pressure chamber. The vibrating plate at the area corresponding to the pressure chamber includes an area P1, an area P2, and an area P3. On the area P1, the piezoelectric layer that is formed to be an activation portion (active portion) is stacked, and the first electrode layer is interposed between the activation portion and the vibrating plate. On the area P2, the piezoelectric layer that is formed to be an inactivation (or inactive) portion is stacked. The first electrode layer is not interposed between the inactivation portion and the vibrating plate on the area P2. On the area P3 of the vibrating plate, the piezoelectric layer is not stacked. When the thickness of the vibrating plate at the area P1 is set to t1, the thickness of the vibrating plate at the area P2 is set to t2, and the thickness of the vibrating plate at the area P3 is set to t3. In one example, the following expression is satisfied.

$$t1 > t2 \geq t3 \qquad (1)$$

According to an example configuration, the vibrating plate at the area P1 is thicker than the vibrating plate at the area P2, and thus it is possible to improve rigidity of the piezoelectric layer at the activation portion including the area P1. A thicker vibrating plate in the area P1 can help prevent the piezoelectric layer from excessively bending in one example in the initial state. The vibrating plate at the area P3 is thinner than the vibrating plate at the area P2, and thus it is possible to suppress movement of the vibrating plate from being prevented on the outside of the piezoelectric layer and to sufficiently transfer pressure fluctuation occurring by deformation of the piezoelectric element to the liquid in the pressure chamber. In other words, because the thickness in the area P3 is thinner than the area P2 and thinner than the area P1, the vibration plate in the area P3 deforms sufficiently to generate an appropriate pressure fluctuation in the liquid in the pressure chamber. As a result, the liquid ejecting head has high reliability.

In one configuration, the vibrating plate be obtained or formed by stacking silicon oxide and zirconium oxide in order from a pressure chamber side. The thickness of the zirconium oxide may be caused to vary in order to satisfy the expression (1).

According to one configuration, it is possible to form a zirconium oxide layer at the areas P1 and P2 on which the piezoelectric layer is stacked. It is possible to suppress lead contained in the piezoelectric layer from being diffused to a lower layer side (silicon oxide side) when lead zirconate titanate (PZT) is fired to form the piezoelectric layer, for example.

In one configuration, a difference between the thickness t1 of the vibrating plate at the area P1 and the thickness t2 of the vibrating plate at the area P2 and a difference between the thickness t2 of the vibrating plate at the area P2 and the thickness t3 of the vibrating plate at the area P3 may be, respectively, equal to or more than 10 nm.

According to one configuration, it is possible to further reliably improve the rigidity of the piezoelectric layer and to further reliably suppress movement of the vibrating plate on the outside of the piezoelectric layer from being prevented. Embodiments of the invention reliably ensure movement of the vibrating plate on the areas outside of the piezoelectric layer at least when generating a pressure fluctuation in the liquid being ejected.

A liquid ejecting apparatus according to one or more embodiments of the invention includes the liquid ejecting head having the above-described configuration.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, embodiments for implementing the invention will be described with reference to the accompanying drawings. In the embodiments which will be described below, various limitations may be applied to a specific example to be appropriate for the invention. However, embodiments of the invention are not limited so long as not departing from the scope of the invention in the description which will be made below. In the description which follows, a liquid ejecting apparatus according to embodiments of the invention may include an ink jet printer (hereinafter, a printer) as an example. An ink jet recording head (hereinafter, recording head) which is one type of a liquid ejecting head may be mounted in the ink jet printer.

Figure 1:
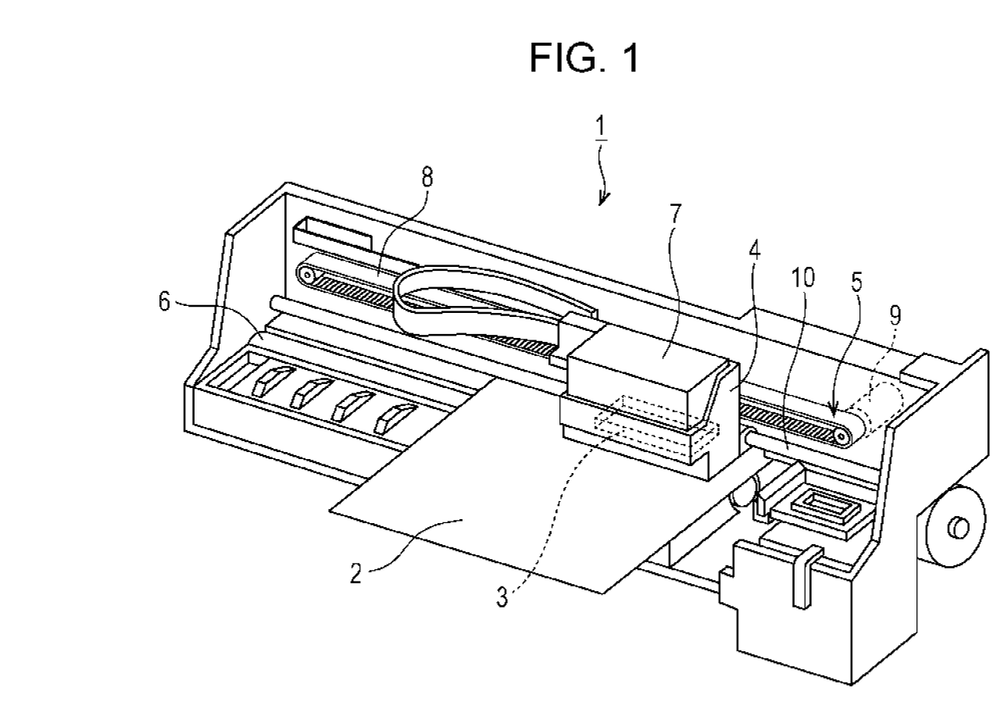
FIG. 1 is a perspective view illustrating a configuration of an example of a printer, which is an example of a liquid ejecting apparatus.

A configuration of a printer 1 will be described with reference to FIG. 1. The printer 1 is an apparatus which records an image or the like on a surface of a recording medium (one type of impact target) 2 such as a recording paper by ejecting liquid type ink drops. The printer 1 includes a recording head 3, a carriage 4, a carriage moving mechanism 5, a transporting mechanism 6, and the like. The recording head 3 is attached to the carriage 4. The carriage moving mechanism 5 moves the carriage 4 in a main scanning direction. The transporting mechanism 6 transports the recording medium 2 in a sub-scanning direction, which is transverse to the main scanning direction. The ink is a type of liquid according to embodiments of the invention. The ink is stored in an ink cartridge 7, which is used as and is an example of a liquid supply source. The ink cartridge 7 is installed in the recording head 3 and is detachable. The ink cartridge is disposed on a main body side of the printer. Accordingly, the configuration may be employed in which the ink is supplied from the ink cartridge to the recording head through an ink supply tube or other suitable path.

The carriage moving mechanism 5 includes a timing belt 8. The timing belt 8 is driven by a pulse motor 9 such as a DC motor. Accordingly, if the pulse motor 9 operates, the carriage 4 is guided along a guide rod 10 which is constructed in the printer 1 and the carriage 4 performs reciprocating movement in the main scanning direction (width direction of the recording medium 2).

Figure 2:
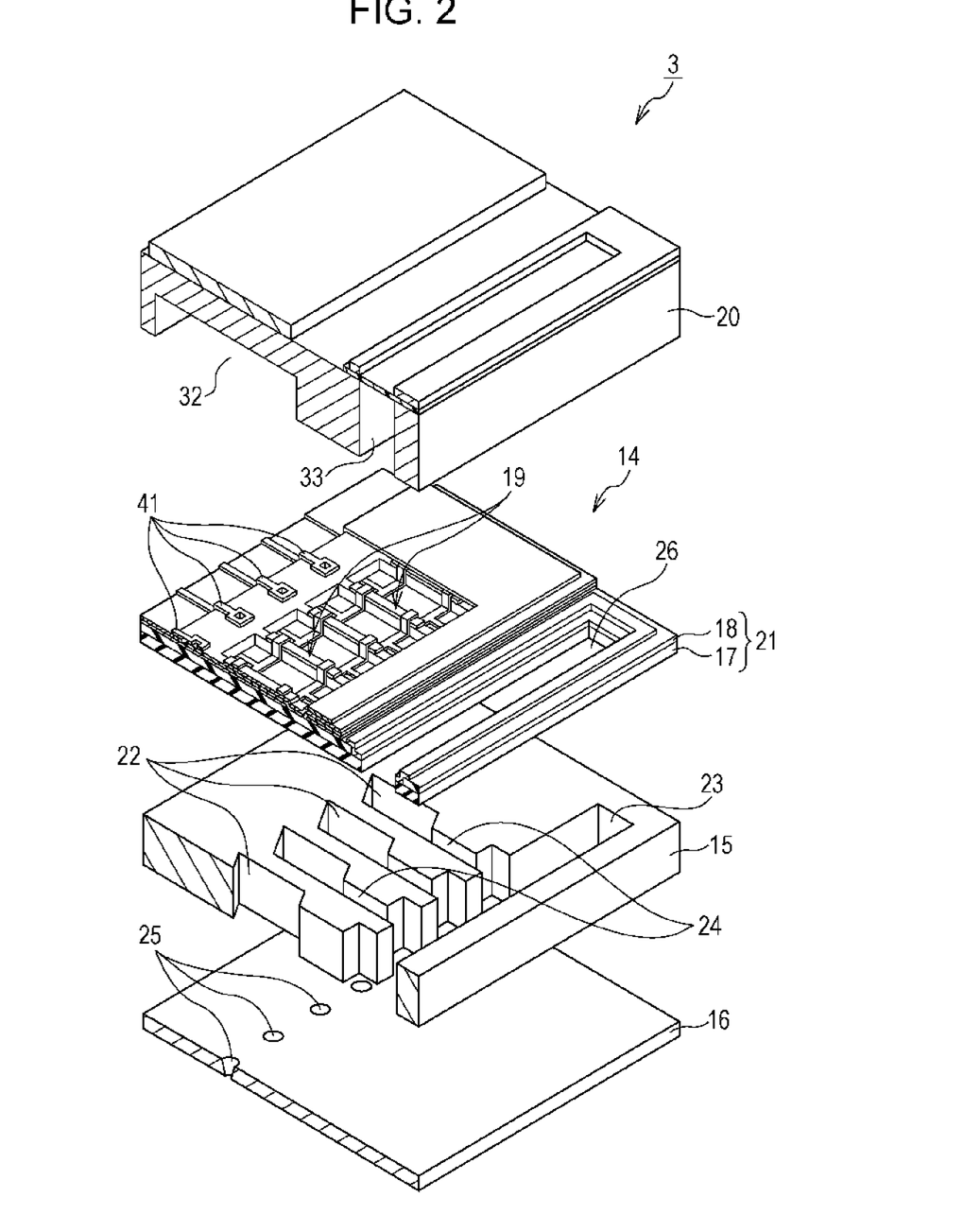
FIG. 2 is an exploded perspective view of an example of a recording head.
Figure 3:
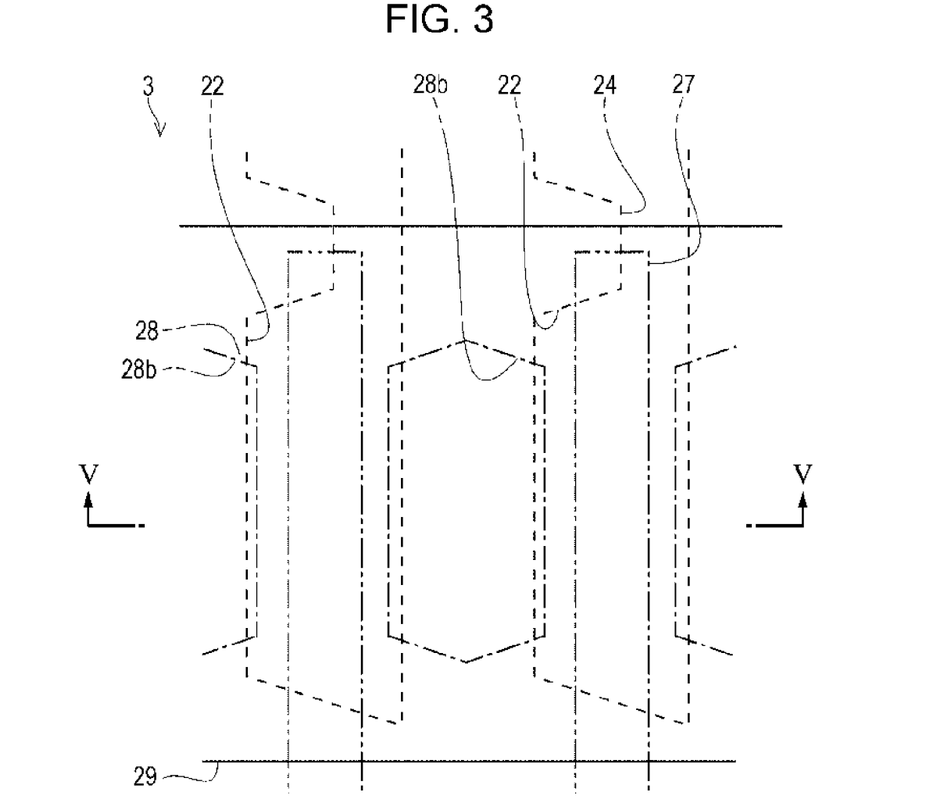
FIG. 3 is a plan view of the recording head.
Figure 4:
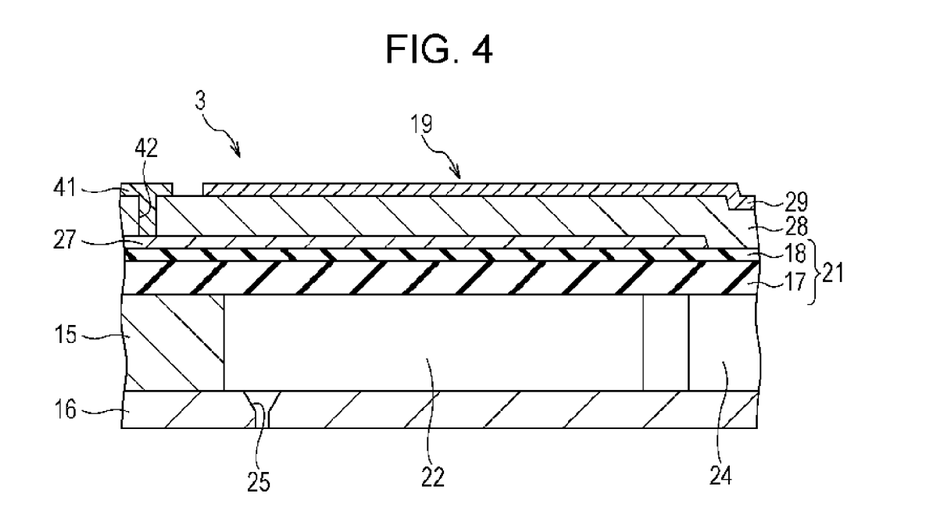
FIG. 4 is a schematic cross-section view taken in a direction orthogonal to a nozzle row and illustrating an example configuration of a main section of the recording head.
Figure 5:
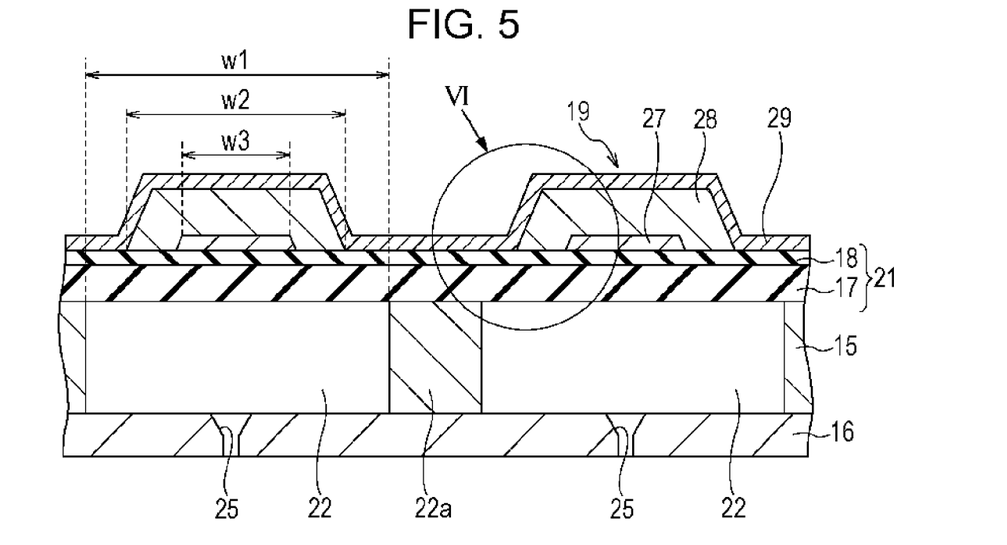
FIG. 5 is a cross-sectional view taken along line V-V in FIG. 3.

FIG. 2 is an exploded perspective view illustrating a configuration of the recording head 3 according to one embodiment. FIG. 3 is a plan view (top view) of the recording head 3. FIG. 3 illustrates a state in which a sealing plate 20 which will be described later is not bonded. That is, FIG. 3 is a plan view of a vibrating plate 21 obtained by stacking layers which will be described later. FIG. 4 and FIG. 5 illustrate a configuration of a main section of the recording head 3. FIG. 4 is a schematic cross-section view taken in a direction orthogonal to a nozzle row. FIG. 5 is a schematic cross-sectional view taken in a nozzle row direction (cross-section taken along line V-V in FIG. 3).

The recording head 3 in one embodiment is configured in such a manner that a pressure chamber formation substrate 15, a nozzle plate 16, an actuator unit 14, a sealing plate 20, and the like are stacked. The pressure chamber formation substrate 15 is a plate member formed from a silicon single crystal substrate in one embodiment. A plurality of spaces is provided in parallel with a partition wall 22a interposed between the plurality of spaces in the pressure chamber formation substrate 15. Each space may be set to be a pressure chamber 22 (corresponding to space according to embodiments of the invention and appropriately referred to as a pressure chamber space below). The pressure chamber space is a vacant portion which is long in a direction orthogonal to a nozzle row direction. The pressure chamber space is provided to have a one-to-one correspond to a nozzle 25 in the nozzle plate 16. That is, the pressure chamber space (or the pressure chamber 22) is formed along the nozzle row direction (a first direction). The pressure chamber spaces (or the pressure chambers 22) are formed to have a pitch between the pressure chamber spaces (or the pressure chambers 22) that is the same as a formation pitch between the nozzles 25. In one embodiment, an upper portion opening (opening on an opposite side to a nozzle 25 side) of the pressure chamber space (pressure chamber 22) has a trapezoid shape, as illustrated in FIG. 3. Regarding a dimension of the pressure chamber space, the height (that is, thickness of the pressure chamber formation substrate 15) is set to approximately 70 μm and the length (dimension in a direction orthogonal to the nozzle row direction or a direction in which the pressure chambers are arranged in parallel) of the pressure chamber space (specifically, upper portion opening) is set to approximately 360 μm. The width w1 (dimension in the nozzle row direction or the direction in which the pressure chambers are arranged in a row) of the pressure chamber space (specifically, upper portion opening) illustrated in FIG. 5 is set to approximately 70 μm. Multiple rows of pressure chambers may be formed in the pressure chamber formation substrate 15.

As illustrated in FIG. 2, a communicating portion 23 is formed at an area in the pressure chamber formation substrate 15 in the direction in which the pressure chambers (or the rows of pressure chambers) are arranged in parallel. The area is positioned outside of the pressure chamber space on a side (opposite side to a side on which the pressure chamber space communicates with the nozzle 25) of a longitudinal direction of the pressure chamber space. The communicating portion 23 passes through the pressure chamber formation substrate 15. The communicating portion 23 is a vacant portion commonly connected to the respective pressure chamber spaces. The communicating portion 23 communicates with the pressure chamber space through the ink supply path 24. Rather, the communicating portion 23 communicates with a plurality of pressure chamber spaces through a plurality of ink supply paths 24. The communicating portion 23 communicates with a communicating opening portion 26 of the vibrating plate 21 which will be described later and a liquid accommodation vacant portion 33 of the sealing plate 20, and thus a reservoir (common liquid chamber) is configured. The reservoir is an ink chamber common to the respective pressure chamber spaces (pressure chambers 22). The ink supply path 24 is formed to have a width narrower than the width of the pressure chamber space. The ink supply path 24 is a portion which acts as passage resistance to the ink flowing in the pressure chamber space from the communicating portion 23.

The nozzle plate 16 (nozzle formation substrate) is bonded to a bottom surface (surface of a side opposite to a side of a surface on which the pressure chamber formation substrate 15 and the actuator unit 14 are bonded) of the pressure chamber formation substrate 15. The nozzle plate 16 is bonded with an adhesive, a thermal bonding film, or the like. In one embodiment, the nozzles 25 are arranged in parallel with a pitch (inter-center distance between the adjacent nozzles 25) in the nozzle plate 16. The pitch corresponds to a dot formation density (for example, 300 dpi to 600 dpi). The nozzle 25 communicates to or with an end portion of the pressure chamber space on a side opposite to the ink supply path 24. The nozzle plate 16 is manufactured by using, for example, a silicon single crystal substrate, stainless steel or the like.

The actuator unit 14 includes the vibrating plate 21 and a piezoelectric element 19. The vibrating plate 21 is formed from an elastic film 17 and an insulator film 18. The elastic film 17 is formed of silicon oxide ($SiO_x$) (for example, silicon dioxide ($SiO_2$)) which is formed on an upper surface of the pressure chamber formation substrate 15. The insulator film 18 is formed of zirconium oxide ($ZrO_x$) which is formed on the elastic film 17. A portion of the vibrating plate 21 corresponding to the pressure chamber space functions as a displacement portion. The portion is a portion obtained by sub-dividing a portion of the pressure chamber 22 with the upper portion opening of the pressure chamber space blocked. The displacement portion performs displacement in a direction far from or away from the nozzle 25 or in a direction close to or towards the nozzle 25, in accordance to bending deformation of the piezoelectric element 19. The vibrating plate 21 at the area corresponding to the pressure chamber 22 is divided into three areas P1, P2, and P3 based on a positional relationship among an upper electrode film 29, a piezoelectric layer 28, and a lower electrode film 27 which will be described later. The three areas P1, P2, and P3 are formed in such a manner that the vibrating plate 21 has a different thickness at each of the three areas P1, P2, and P3. The description regarding this will be made below in detail. As illustrated in FIG. 2, a communicating opening portion 26 is provided in a portion of the vibrating plate 21 corresponding to the communicating portion 23 of the pressure chamber formation substrate 15. The communicating opening portion 26 communicates with the communicating portion 23.

The piezoelectric element 19 is formed at a portion of the vibrating plate 21 (insulator film 18) corresponding to the pressure chamber space, that is, on an upper surface (surface of an opposite side to a nozzle 25 side) of the displacement portion. In one embodiment, the piezoelectric element 19 is configured in such a manner that a lower electrode film 27 (corresponding to a first electrode layer in one embodiment), a piezoelectric layer 28, and an upper electrode film 29 (corresponding to a second electrode layer in one embodiment) are stacked in order from a vibrating plate 21 side using a film forming technology. As illustrated in FIG. 5, the lower electrode film 27 is provided independently for each pressure chamber 22. The upper electrode film 29 is provided continuously through or for the plurality of pressure chambers 22. Accordingly, the lower electrode film 27 is set to be an individual electrode for each pressure chamber 22 and the upper electrode film 29 is set to be a common electrode which is common to the respective pressure chambers 22.

Specifically, as illustrated in FIG. 3 and FIG. 5, both end portions of the upper electrode film 29 in the nozzle row direction extend beyond an edge of the upper portion opening of the pressure chamber space to the outside of the plurality of the pressure chamber spaces (pressure chamber 22) which are provided in a row. Both of the end portions of the upper electrode film 29 in a longitudinal direction (direction orthogonal to the nozzle row direction) of the pressure chamber 22 (pressure chamber space) are extended to the outside of the corresponding pressure chamber space (pressure chamber 22) beyond an edge of the upper portion opening of the pressure chamber space. The lower electrode film 27 in the longitudinal direction of the pressure chamber 22 (pressure chamber space) has an end portion on one side (upper side in FIG. 3) and an end portion on another side (lower side in FIG. 3). The end portion on the one side is extended to a location overlapped with the ink supply path 24 beyond the edge of the upper portion opening of the pressure chamber 22 and the end portion on the other side is extended to a lead electrode portion 41.

As illustrated in FIG. 5, the width w3 of the lower electrode film 27 in the nozzle row direction over the pressure chamber space (at an area corresponding to the pressure chamber 22) is narrower than the width w1 of the pressure chamber 22 (specifically, the upper portion opening of the pressure chamber space) in the nozzle row direction. The width w2 of the piezoelectric layer 28 in the nozzle row direction over the pressure chamber space is narrower than the width w1 of the pressure chamber 22 in the nozzle row direction and the width w2 is wider than the width w3 of the lower electrode film 27 in the nozzle row direction. That is, dimensions in the nozzle row direction become smaller in order of the width of the upper electrode film 29, the width w1 of the pressure chamber 22, the width w2 of the piezoelectric layer 28, and the width w3 of the lower electrode film 27.

In one embodiment, as illustrated in FIG. 3, the piezoelectric layer 28 is divided so as to correspond to each piezoelectric element 19 by an opening portion 28b. The opening portion 28b is obtained by partially removing the piezoelectric layer 28 (e.g., PZT layer 28a). Specifically, the piezoelectric layer 28 is formed in such a manner that the piezoelectric layer 28 is extended to the outside of the pressure chamber 22 beyond both of the end portions (specifically, edges of the upper portion opening on both sides of the pressure chamber space) of the pressure chamber 22 in the longitudinal direction and the piezoelectric layer 28 covers the plurality of pressure chambers 22. The piezoelectric layer 28 is partially removed at an area corresponding to a portion between adjacent pressure chambers 22. A plurality of the opening portions 28b at which the piezoelectric layer 28 is not stacked is formed. That is, the plurality of the opening portions 28b is formed in the nozzle row direction with the same pitch as a formation pitch between the pressure chambers 22 (formation pitch between the nozzles 25). The opening portions 28b correspond to areas where the piezoelectric layer 28 has been removed. In other words, the piezoelectric element 19 corresponding to one pressure chamber 22 is formed between the opening portion 28b and the opening portion 28b with the same pitch as the formation pitch between the pressure chambers 22. In other words, one pressure chamber is formed between adjacent opening portions 28b. The opening portion 28b in one embodiment is formed to have an elongated hexagonal shape (or other shape) which is long in the longitudinal direction of the pressure chamber 22, in a plan view. The piezoelectric layer 28 at an area outside of the opening portion 28b is formed continuously through or over the plurality of the pressure chambers in the longitudinal direction of the pressure chamber 22.

In this manner, the piezoelectric element 19 is formed by stacking the lower electrode film 27, the piezoelectric layer 28, and the upper electrode film 29. Thus, the piezoelectric layer 28 is formed over the lower electrode film 27 and the upper electrode film 29 is formed over the piezoelectric layer 28. Accordingly, the vibrating plate 21 at an area corresponding to the pressure chamber 22 is divided into the three areas by overlapping portions of the respective films 27, 28, and 29. Specifically, the vibrating plate 21 is divided into the three areas including the area P1, the area P2, and the area P3. At the area P1, the lower electrode film 27, the piezoelectric layer 28, and the upper electrode film 29 are stacked. The area P2 is outside of the lower electrode film 27 and the piezoelectric layer 28 and the upper electrode film 29 are stacked at the area P2. The lower electrode film 27 is not stacked at the area P2. The area P3 is outside of both the lower electrode film 27 and the piezoelectric layer 28 and only the upper electrode film 29 is stacked at the area P3 (see FIG. 6). In one embodiment, the areas P1, P2, and P3 are formed on both sides in the nozzle row direction, respectively. More specifically, for a given pressure chamber, the areas P1, P2 and P3 are formed over both sides of the pressure chamber space in the nozzle row direction. Since the areas P1, P2, and P3 are formed to have bilateral symmetry, the areas on one side will be mainly described below.

The piezoelectric layer 28 is interposed between the lower electrode film 27 and the upper electrode film 29 over the vibrating plate 21 at the area P1. Thus, the piezoelectric layer 28 stacked at the area P1 is set to be the activation portion (active portion or active region) at which piezoelectric distortion occurs by applying a voltage to both electrodes. The piezoelectric layer 28 is not interposed between the lower electrode film 27 and the upper electrode film 29 on the vibrating plate 21 at the area P2 at which the lower electrode film 27 is not formed. Rather, the piezoelectric layer 28 is interposed between the vibrating plate 21 (insulator film 18) and the upper electrode film 29 in the area P2. Thus, the piezoelectric layer 28 stacked at the area P2 is set to be an inactivation portion (inactive portion or inactive region) at which piezoelectric distortion does not occur even though a voltage is applied to both of the electrodes.

In one example, the width w2 of the piezoelectric layer 28 may be set to be in a range of 30 to 60 μm on the pressure chamber space in the nozzle row direction and, in one embodiment, the width w2 is set to approximately 52 μm. In one example, the width w3 of the lower electrode film 27 may be set to be in a range of 15 to 60 μm and, in one embodiment, the width w3 is set to approximately 40 μm. In one example, a distance w4 (see FIG. 6) from an outer end portion of the lower electrode film 27 on one side to an outer end portion of the piezoelectric layer 28 on the one side may be set to be in a range of 2.5 to 8.0 μm. The distance w4 may also mean the width w4 of the area P2 on the one side in the nozzle row direction. In one embodiment, the distance w4 is set to approximately 6 μm.

The upper electrode film 29 and the lower electrode film 27 may be formed of various metals, the alloys of the various metals, and the like. The various metals may include, but are not limited to, iridium (Ir), platinum (Pt), titanium (Ti), tungsten (W), tantalum (Ta), molybdenum (Mo), and the like. The piezoelectric layer 28 may be formed of a ferroelectric piezoelectric material such as lead zirconate titanate (PZT), relaxor ferroelectrics, and the like. The relaxor ferroelectrics are obtained by adding metal such as niobium, nickel, magnesium, bismuth and yttrium to the ferroelectric piezoelectric material. In one example, the thickness of the upper electrode film 29 may be set to be in a range of 15 to 100 μm and, in one embodiment, the thickness of the upper electrode film 29 is set to approximately 70 μm. In one example, the thickness of the piezoelectric layer 28 (specifically, the thickness of the piezoelectric layer 28 at the area P1) may be set to be in a range of 0.7 to 5 μm and, in one embodiment, the thickness of the piezoelectric layer 28 is set to approximately 1 μm. In one example, the thickness of the lower electrode film 27 may be set to be in a range of 50 to 300 μm and, in one embodiment, the thickness of the lower electrode film 27 is set to approximately 150 μm.

The lead electrode portion 41 is formed at a location which is positioned on the piezoelectric layer 28 at an area outside of the edge of the upper portion opening of the pressure chamber space in the longitudinal direction of the pressure chamber space and is separated from the upper electrode film 29 by a predetermined distance (positioned on the left side of FIG. 4). As illustrated in FIG. 4, a through hole 42 is formed to reach the lower electrode film 27 from the upper surface of the piezoelectric layer 28 at a position at which the lead electrode portion 41 is formed in the piezoelectric layer 28 in a state of passing through the piezoelectric layer 28. The lead electrode portion 41 is patterned corresponding to the lower electrode film 27 which is an individual electrode. The lead electrode portion 41 is electrically connected with the lower electrode film 27 through the through hole 42. The driving voltage (driving pulse) is selectively applied to the piezoelectric elements 19 through the lead electrode portions 41.

As illustrated in FIG. 2, a sealing plate 20 is bonded to an upper surface of the actuator unit 14 opposite to a bottom surface. The bottom surface is a bonding surface of the actuator unit 14 and the pressure chamber formation substrate 15. The sealing plate 20 includes an accommodation vacant portion 32 able to accommodate the piezoelectric element 19. A liquid accommodation vacant portion 33 is provided at an area which is positioned outside of the accommodation vacant portion 32 in a direction orthogonal to a nozzle row direction and corresponds to the communicating opening portion 26 of the vibrating plate 21 and the communicating portion 23 of the pressure chamber formation substrate 15, in the sealing plate 20. The liquid accommodation vacant portion 33 passes through the sealing plate 20 in the thickness direction of the sealing plate 20 and the liquid accommodation vacant portion 33 is provided in a direction where the liquid accommodation vacant portion 33 and the pressure chamber space (pressure chamber 22) are disposed in parallel. The liquid accommodation vacant portion 33 communicates with the communicating opening portion 26 and the communicating portion 23 in series to constitute a reservoir which is the ink chamber common to the respective pressure chamber spaces, as described above. A wiring opening portion (not illustrated) may be provided in the sealing plate 20 in addition to the accommodation vacant portion 32 and the liquid accommodation vacant portion 33. The wiring opening portion passes through the sealing plate 20 in the thickness direction of the sealing plate 20. An end portion of the lead electrode portion 41 is exposed in the wiring opening portion. A terminal of a wiring member (not illustrated) from a main body side of a printer is electrically connected to an exposure portion of the lead electrode portion 41.

In the recording head 3 of the above-described configuration, the ink is taken from the ink cartridge 7 and a flow passage of the reservoir, the ink supply path 24, the pressure chamber 22, and the nozzle 25 is filled with ink. A driving signal is applied from the main body side of the printer, and thus an electric field is given in accordance to a potential difference of both of the electrodes between the lower electrode film 27 and the upper electrode film 29 which correspond to the pressure chamber 22. The displacement portion of the piezoelectric element 19 and the vibrating plate 21 performs displacement in accordance with the electric field or the applied voltage, and thus pressure fluctuation occurs in the pressure chamber 22. Control of the pressure fluctuation causes the ink to be ejected from the nozzle 25.

Figure 6:
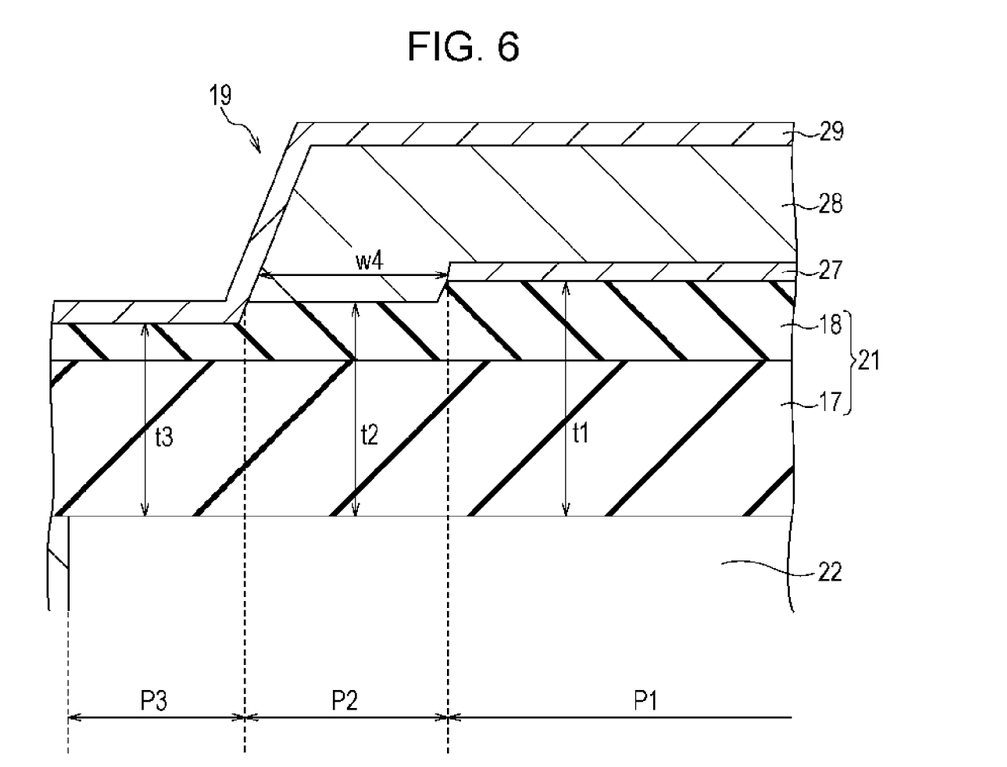
FIG. 6 is an enlarged view of an area VI in FIG. 5.

The recording head 3 according to one embodiment of the invention is configured in such a manner that a relationship of the thicknesses of the vibrating plate 21 at the area P1, P2, and P3 satisfies an expression of P1>P2≥P3 such that the piezoelectric element 19 (piezoelectric layer 28) is suppressed from excessively bending without deformation of a vibrating plate 21 being prevented in a state where a driving voltage is not applied to both of the electrodes (initial state), as illustrated in FIG. 6. That is, the recording head 3 is configured in such a manner that when the thickness of the vibrating plate at the area P1 is set to t1, the thickness of the vibrating plate at the area P2 is set to t2, and the thickness of the vibrating plate at the area P3 is set to t3, the following (1) expression is satisfied.

$$t1 > t2 \geq t3 \tag{1}$$

This configuration of the vibrating plate 21 ensures that, when in the initial state, the piezoelectric element is not excessively bent. An excessively bend piezoelectric element may not be able to generate a sufficient pressure fluctuation.

In one embodiment, the configuration is made in such a manner that the elastic film 17 is formed of silicon dioxide ($SiO_2$) and the thicknesses of the elastic film 17 at the area P1, P2, and P3 are matched to be constant. The insulator film 18 is formed of zirconium oxide ($ZrO_x$) and the thicknesses of the insulator film 18 at the area P1, P2, and P3 are different from each other. Thus the above-described (1) expression is satisfied. In one example, a difference between the thickness of the vibrating plate 21 (insulator film 18) at the area P1 and the thickness of the vibrating plate 21 (insulator film 18) at the area P2 and a difference between the thickness of the vibrating plate 21 (insulator film 18) at the area P2 and the thickness of the vibrating plate 21 (insulator film 18) at the area P3 may be respectively in a range of 5 to 50 nm. The differences may be equal to or more than 10 nm. For example, the thickness of the elastic film 17 may be set to approximately 1500 nm. The thickness of the insulator film 18 at the area P1 may be set to approximately 420 nm. The thickness of the insulator film 18 at the area P2 may be set to approximately 380 nm. The thickness of the insulator film 18 at the area P3 may be set to approximately 340 nm. It is desired that the thickness of the elastic film 17 be set to be in a range of 300 to 2000 nm. In one example, the thickness of the insulator film 18 at the area P1 may be equal to or less than 600 nm. In one example, the thickness of the insulator film 18 at the area P3 may be equal to or more than 30 nm.

In this manner, the vibrating plate 21 is thick at the area P1 at which the lower electrode film 27, the piezoelectric layer 28, and the upper electrode film 29 are stacked, and thus it is possible to improve rigidity of the piezoelectric layer 28 which is set to be or which is located in the activation portion. That is, it is possible to make the piezoelectric element 19 at the area P1 have rigidity to the extent of appropriate descent of the neutral axis and to suppress the piezoelectric element from excessively bending in the initial state. The vibrating plate 21 is thin at the area P3 which is outside of the lower electrode film 27 and the piezoelectric layer 28 and at which only the upper electrode film 29 is stacked, and thus it is possible to suppress movement of the vibrating plate 21 from being prevented on the outside of the piezoelectric layer 28 and to sufficiently transfer pressure fluctuation occurring by deformation of the piezoelectric element 19 to the ink in the pressure chamber 22. That is, it is possible to reduce transfer loss in transferring a driving force in the piezoelectric element 19 to the ink in the pressure chamber 22. The relative thinness of at the area P3 ensures that the vibration plate 21 deforms while the relative thickness at the area P1 ensures that the piezoelectric layer is not excessively bended in an initial state.

Accordingly, it is possible to suppress the driving voltage of the piezoelectric element 19 required for ejecting a predetermined amount of the ink from the nozzle 25 from decreasing. It is possible to achieve power savings and to extend the life span of the piezoelectric element 19. As a result, the reliability of the recording head 3 is improved. Furthermore, the insulator film 18 formed of zirconium oxide ($ZrO_x$) is formed at the areas P1 and P2 at which the piezoelectric layer 28 is stacked, and thus it is possible to suppress lead contained in the piezoelectric layer 28 from being diffused to a lower layer (elastic film 17) side when lead zirconate titanate (PZT) is fired to form the piezoelectric layer 28. A difference between the thickness of the vibrating plate 21 at the area P1 and the thickness of the vibrating plate 21 at the area P2 and a difference between the thickness of the vibrating plate 21 at the area P2 and the thickness of the vibrating plate 21 at the area P3 may be respectively equal to or more than 10 nm. Thus it is possible to further reliably improve rigidity of the piezoelectric layer 28 and to further reliably suppress movement of the vibrating plate 21 from being prevented on the outside of the piezoelectric layer 28. In other words, it is possible to ensure adequate flexibility of the vibrating plate 21 on the outside of the piezoelectric layer 21

The configuration may be made in such a manner that the thickness of the vibrating plate 21 at the area P2 is equal to the thickness of the vibrating plate 21 at the area P3 and the upper surface of the insulator film 18 is formed to be flat in the boundary between the area P2 and the area P3. That is, "t2=t3" may be set. In this case, the vibrating plate 21 at the area P1 may be also thick, compared to the vibrating plate 21 at the area P2 and the area P3, and thus it is possible to improve rigidity of the piezoelectric element 19 at the area P1. Meanwhile, since the vibrating plate 21 at the areas P2 and P3 is thin, it is possible to suppress movement of the vibrating plate 21 on the outside of the piezoelectric layer 28 from being prevented and to sufficiently transfer pressure fluctuation occurring by deformation of the piezoelectric element 19 to the ink in the pressure chamber 22. If the vibrating plate 21 at the area P3 is thinner than the vibrating plate 21 at the area P2, that is, if "t2>t3" is set, it is possible to further suppress movement of the vibrating plate 21 from being prevented.

Figure 7A:
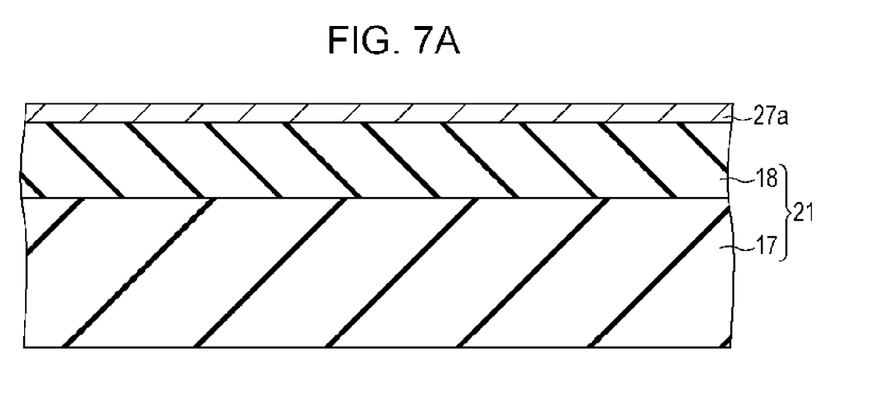
FIGS. 7A to 7C are schematic diagrams illustrating a process of forming a vibrating plate.
Figure 7B:
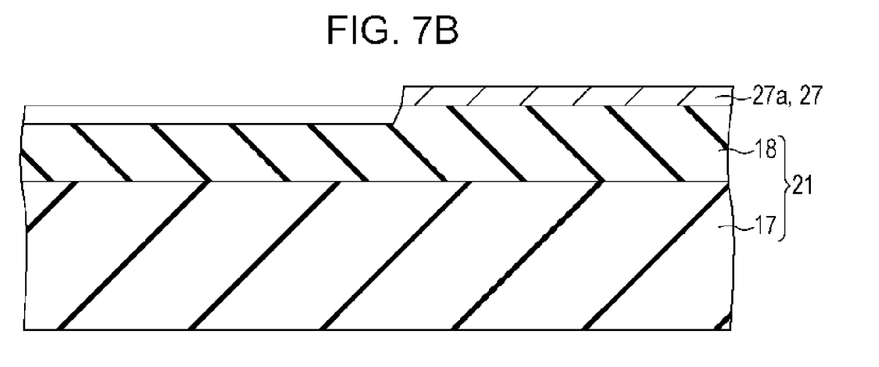

A manufacturing method of the vibrating plate 21 and the piezoelectric element 19 will be described below. First, the insulator film 18, which is formed of zirconium oxide ($ZrO_x$) is formed on the elastic film 17, which is formed of silicon dioxide ($SiO_2$), using a sputtering method or the like. Then, as illustrated in FIG. 7A, a lower metal layer 27a to be the lower electrode film 27 is formed on the entire surface of the insulator film 18 using a sputtering method or the like. Thereafter, the lower metal layer 27a is patterned to have a predetermined shape by etching. Specifically, a pattern to be a mask for etching is provided on the lower metal layer 27a using a photolithography method or the like. The lower metal layer 27a is etched from an upper surface of the lower metal layer 27a using an etching solution which is an aqueous solution or the like. At this time, etching is performed equal to or more than the thickness of the lower metal layer 27a by controlling an etching time and the like. Thus, as illustrated in FIG. 7B, the insulator film 18 corresponding to an area (areas P2 and P3) other than the lower metal layer 27a remaining as the lower electrode film 27 is etched. In this example, the insulator film 18 corresponding to the vibrating plate 21 at the area P1 is not etched, the lower electrode film 27 is formed on this insulator film 18, and the insulator film 18 corresponding to the vibrating plate 21 at the area P2 and the area P3 is over-etched. As a result, a level difference at the boundary between the area P1 and the area P2 is formed and the insulator film 18 corresponding to the areas P2 and P3 is lower than a portion corresponding to the area P1 by one step.

Figure 7C:
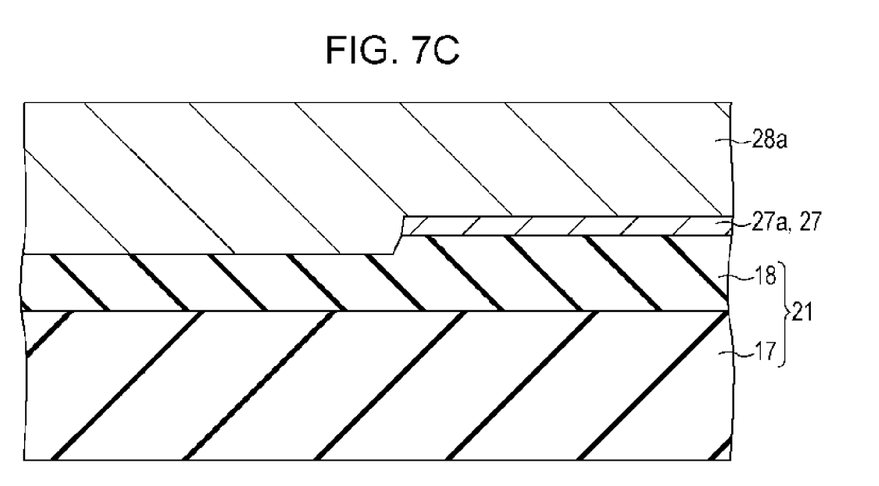
Figure 8A:
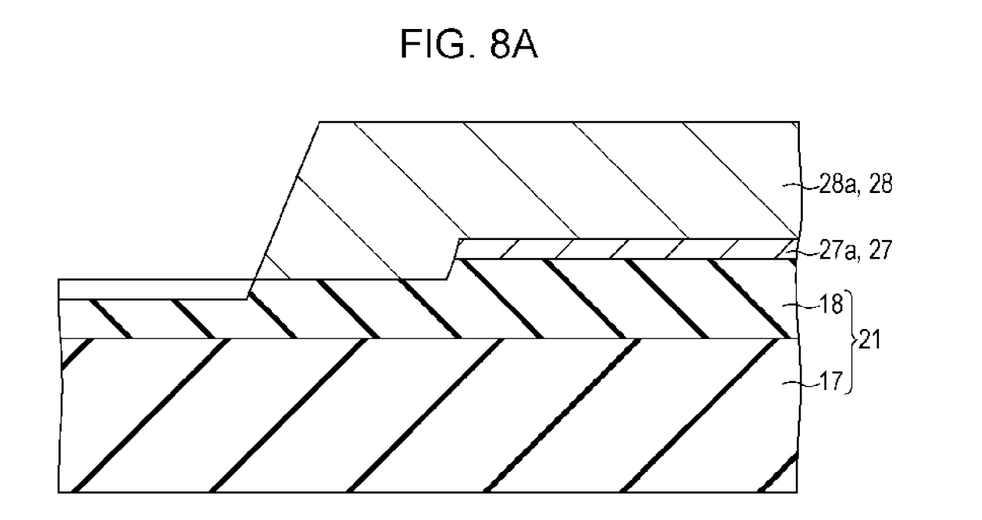
FIGS. 8A and 8B are schematic diagrams illustrating an example process of forming the vibrating plate.

If the lower electrode film 27 is formed on the insulator film 18, as illustrated in FIG. 7C, the PZT layer 28a to be a piezoelectric layer 28 is formed on the entire surface of the insulator film 18 on which the lower electrode film 27 is formed. A forming method of the PZT layer 28a is not particularly limited. For example, a sol-gel method is used in which a so-called sol which is dissolved and distributed using a metal organic material as a catalyst is applied and dried to be a gel and the gel is fired at a high temperature to obtain the PZT layer 28a formed of a metallic oxide. Additionally, the PZT layer 28a may be formed using various methods of a sputtering method, an IJ applying method, and the like. Thereafter, a pattern to be a mask for etching is formed on the PZT layer 28a by using a photolithography method and the PZT layer 28a is patterned by etching to have a predetermined shape. At this time, etching is performed equal to or more than the thickness of the PZT layer 28a by controlling an etching time and the like. As illustrated in FIG. 8A, the insulator film 18 corresponding to an area (area P3) other than the PZT layer 28a remaining as the piezoelectric layer 28 including the opening portion 28b is etched. In this example, the insulator film 18 corresponding to the vibrating plate 21 at the areas P1 and P2 is not etched, the piezoelectric layer 28 is formed on an upper surface of the insulator film 18, and the insulator film 18 corresponding to the vibrating plate 21 (opening portion 28b) at the area P3 is over-etched. As a result, a level difference at the boundary between the area P2 and the area P3 is formed and the insulator film 18 corresponding to the area P3 is lower than or thinner than the insulator film 18 corresponding to the area P2 by one step. The area P2 and the area P3 may have the same thickness without etching (over-etching) the PZT layer 28a equal to or more than the thickness of the PZT layer 28a.

Figure 8B:
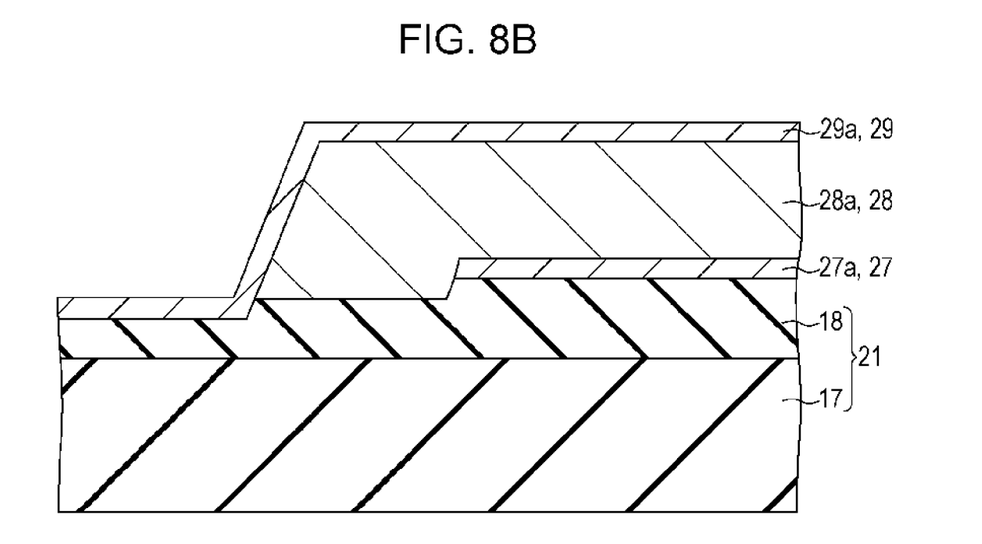

Then, as illustrated in FIG. 8B, an upper metal layer 29a to be the upper electrode film 29 is formed on the entire surface of the insulator film 18 on which the lower electrode film 27 and the piezoelectric layer 28 are formed, by using a sputtering method or the like. A pattern to be a mask for etching is formed on the upper metal layer 29a by using a photolithography method and the upper metal layer 29a is patterned to have a predetermined shape by etching. In this manner, the vibrating plate 21 and the piezoelectric element 19 according to one embodiment may be formed.

Embodiments of the invention are not limited to the above-described embodiments and various modifications may be made based on the description herein.

For example, in one embodiment, the vibrating plate 21 at the area P3 is configured by the two layers of the elastic film 17 and the insulator film 18, but is not limited thereto. For example, the insulator film may be completely removed and the vibrating plate at the area P3 may be configured by only the elastic film. That is, the insulator film at the area P3 may have a thickness of 0 nm. The main point is that the insulator film at the area P3 may have a thickness of any value as long as the insulator film (vibrating plate) at the area P3 is thinner than the insulator film (vibrating plate) at the area P2 or equal in thickness to the area P2. The shape of the pressure chamber 22 (pressure chamber space) is not limited to the above-described embodiments. For example, an inner wall surface sub-dividing the pressure chamber space may be inclined to the top surface and the bottom surface of the pressure chamber formation substrate. In this case, the width of the pressure chamber corresponds to the opening width of the upper portion opening of the pressure chamber space. Thus, the width of the pressure chamber may vary with respect to the thickness direction of the pressure chamber formation substrate.

In the above-described embodiments, among the areas of the vibrating plate 21 corresponding to the pressure chamber 22, the entirety of an area at which the lower electrode film 27, the piezoelectric layer 28, and the upper electrode film 29 are stacked is set to be the area P1, the entirety of an area which is outside of lower electrode film 27 and at which the piezoelectric layer 28 and the upper electrode film 29 are stacked is set to be the area P2, and the entirety of an area which is outside of the lower electrode film 27 and the piezoelectric layer 28 and at which only the upper electrode film 29 is stacked is set to be the area P3. However, the respective areas P1, P2, and P3 are not limited thereto. Each area may include an area at which the thickness of the vibrating plate is different from each other. For example, an area which is outside of the lower electrode film 27 and at which the piezoelectric layer 28 and the upper electrode film 29 are stacked may include an area P2 with the thickness of t2 and an area P2' with the thickness larger than or smaller than t2. An area which is outside of the lower electrode film 27 and the piezoelectric layer 28 and at which only the upper electrode film 29 is stacked may include an area P3 with the thickness of t3 and an area P3' with the thickness larger than or smaller than t3. This may be applied to the area P1, similarly. Particularly, when the area P2' is thicker than the area P2, if the area P2 is wider than the area P2', the effect that the deformation of the vibrating plate is not prevented is largely improved. This may be applied to a case where the area P3' is thicker than the area P3, similarly. Such a difference between the thicknesses of the vibrating plate at the respective areas may be formed due to manufacturing tolerance.

In the above-described embodiments, the upper portion opening of the pressure chamber space (pressure chamber 22) has a trapezoid shape and the opening portion 28b formed in the piezoelectric layer 28 has an elongated hexagonal shape, but the shapes of the upper portion opening of the pressure chamber space and the opening portion 28b formed in the piezoelectric layer 28 are not limited thereto. The pressure chamber space (pressure chamber), the piezoelectric layer (opening portion), the respective electrode films, and the like may have various shapes.

Figure 9:
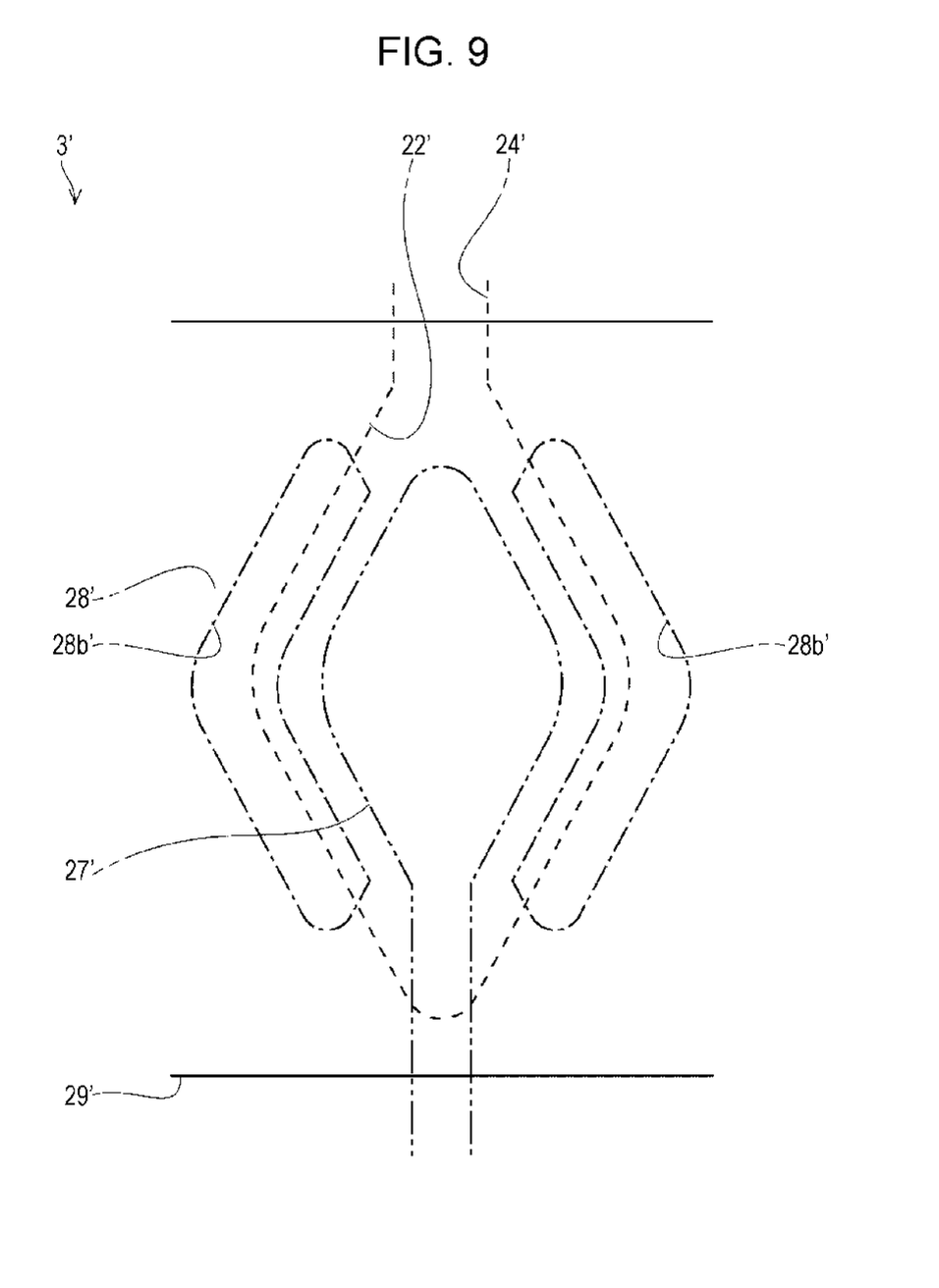
FIG. 9 is a plan view of a recording head according to one embodiment.

For example, in a recording head 3' according to an embodiment illustrated in FIG. 9, an upper portion opening of a pressure chamber space (pressure chamber 22') has a substantially elliptical shape in a plan view. A lower electrode film 27' is formed with a substantially elliptical shape such that the shape of the lower electrode film 27' matches the shape of the pressure chamber 22'. An opening portion 28b' of the piezoelectric layer 28' is formed on both sides of the pressure chamber 22' in the nozzle row direction, along an edge of an upper portion opening of the pressure chamber 22'. An upper electrode film 29' is extended to the outside of a plurality of pressure chambers 22' which are provided in series in a direction in which the pressure chambers 22' are arranged in series (nozzle row direction), similarly to the upper electrode film 29 in the above-described embodiments. The upper electrode film 29' in a longitudinal direction of the pressure chamber 22' has an end portion on one side (upper side in FIG. 9) and an end portion on another side (lower side in FIG. 9). The end portion on one side is extended to a location overlapped with an ink supply path 24'. The end portion on the other side is extended to the outside of the pressure chamber 22'.

In one embodiment, dimensions of the respective layers in the nozzle row direction become smaller in order of the width of the upper electrode film 29', the width of the pressure chamber 22', the width of the piezoelectric layer 28', and the width of the lower electrode film 27'. Accordingly, there are three areas; an area P1 at which the lower electrode film 27', the piezoelectric layer 28', and the upper electrode film 29' are stacked, an area P2 which is outside of the lower electrode film 27' and at which the piezoelectric layer 28' and the upper electrode film 29' are stacked, and an area P3 which is outside of the lower electrode film 27' and the piezoelectric layer 28' and at which only the upper electrode film 29' is stacked. The thicknesses t1 to t3 of the vibrating plate at the respective areas P1 to P3 are configured in such a manner that the expression (1) is satisfied. With these example configurations, it is possible to suppress the piezoelectric layer 28' from excessively bending in the initial state and to suppress movement of the vibrating plate on the outside of the piezoelectric layer 28' from being prevented. In other words, the thickness of the area P1 can help prevent the piezoelectric layer 28' from excessively bending while the thinner thickness of the area P2 and/or P3 ensure that the vibration plate can be sufficiently deformed such that liquid can be appropriately ejected from the pressure chamber. Other components are the same as the components in the above-described embodiment and the descriptions thereof will be omitted.

In the above-described embodiments, an ink jet type recording head mounted in an ink jet printer is described as an example. However, if a device includes the piezoelectric element and the pressure chamber in the configuration, the device may be applied to an apparatus ejecting liquid other than the ink. The embodiments according to the invention may be applied to a coloring material ejecting head, an electrode material ejecting head, a biological organic material ejecting head, and the like, for example. The coloring material ejecting head is used in manufacturing of a color filter of a liquid crystal display or the like. The electrode material ejecting head is used in forming of an electrode of an organic Electro Luminescence (EL) display, a field emission display (FED), and the like. The biological organic material ejecting head is used in manufacturing of a biochip (biochemical element). Additionally, embodiments are not limited to an apparatus including a piezoelectric element which is functionally deformed by applying a voltage and functions as a so-called actuator and the embodiments may be applied to an apparatus including a piezoelectric element which passively outputs an electric signal by receiving movement from the outside of the piezoelectric element and functions as a so-called sensor.

What is claimed is:

1. A piezoelectric device comprising:
a pressure chamber formation substrate in which a plurality of spaces is formed, wherein the plurality of spaces are arranged in a first direction; and
a piezoelectric element that includes a first electrode layer, a piezoelectric layer, and a second electrode layer that are stacked in order on a vibrating plate that covers the pressure chamber formation substrate so as to block the plurality of spaces,
wherein:
the first electrode layer is provided independently for each pressure chamber and the second electrode layer is provided continuously for the plurality of the pressure chambers,
the vibrating plate, at the area corresponding to the pressure chamber, includes an area A, and an area B, the area A corresponding to an area on which an activation portion of the piezoelectric layer is stacked, and
the area B corresponding to an area on which the piezoelectric layer is not stacked, and
when a thickness of the vibrating plate at the area A has tA, and a thickness of the vibrating plate at the area B has tB, the following expression is satisfied, $tA > tB.$ 2. The piezoelectric device according to claim 1,
wherein the vibrating plate includes silicon oxide and zirconium oxide stacked in order from a pressure chamber side, and
the thickness of the zirconium oxide is caused to vary in order to satisfy the expression tA>tB.
3. The piezoelectric device according to claim 1,
wherein a difference between the thickness tA and the thickness tB is equal to or more than 10 nm.
4. The piezoelectric device according to claim 1,
wherein the vibrating plate includes an elastic film and an insulator film,
the elastic film has a thickness which is in a range of 300 to 2000 nm,
a thickness of the insulator film at the thickness tA is equal to or less than 600 nm, and a thickness of the insulator film at the thickness tB is equal to or more than 30 nm.
5. The piezoelectric device according to claim 1,
wherein a distance from an outer end portion of the first electrode layer on one side in the first direction to an outer end portion of the piezoelectric layer on the one side is in range of 2.5 to 8.0 μm.
6. A liquid ejecting apparatus comprising:
the piezoelectric device according to claim 1.
7. A piezoelectric device comprising:
a pressure chamber formation substrate in which a plurality of spaces is formed, wherein the plurality of spaces are arranged in a first direction; and
a piezoelectric element that includes a first electrode layer, a piezoelectric layer, and a second electrode layer that are stacked in order on a vibrating plate that covers the pressure chamber formation substrate so as to block the plurality of spaces,
wherein:
the first electrode layer is provided independently for each pressure chamber and the second electrode layer is provided continuously for the plurality of the pressure chambers,
the vibrating plate, at the area corresponding to the pressure chamber, includes an area X, and an area Y, the area X corresponding to an area on which an inactivation portion of the piezoelectric layer is stacked, and
the area Y corresponding to an area on which the piezoelectric layer is not stacked, and
when a thickness of the vibrating plate at the area X has tX, and a thickness of the vibrating plate at the area Y has tY, the following expression is satisfied, $tX \geq tY.$ 8. The piezoelectric device according to claim 7,
wherein the vibrating plate includes silicon oxide and zirconium oxide stacked in order from a pressure chamber side, and
the thickness of the zirconium oxide is caused to vary in order to satisfy the expression tX≥tY.
9. The piezoelectric device according to claim 7,
wherein a difference between the thickness tX and the thickness tY is equal to or more than 10 nm.
10. The piezoelectric device according to claim 7,
wherein the vibrating plate includes an elastic film and an insulator film,
the elastic film has a thickness which is in a range of 300 to 2000 nm,
a thickness of the insulator film at the thickness tY is equal to or more than 30 nm.
11. The piezoelectric device according to claim 7,
wherein a distance from an outer end portion of the first electrode layer on one side in the first direction to an outer end portion of the piezoelectric layer on the one side is in range of 2.5 to 8.0 μm.
12. A liquid ejecting apparatus comprising:
the piezoelectric device according to claim 7.
13. A piezoelectric device comprising:
a pressure chamber formation substrate that includes a plurality of pressure chambers;
a vibration plate formed on the pressure chamber formation substrate;
a plurality of piezoelectric elements, wherein each pressure chamber is associated with one of the plurality of piezoelectric elements, each piezoelectric element including a first electrode layer, a piezoelectric layer, and a second electrode layer;
wherein the first electrode layer is provided independently for each pressure chamber and the second electrode layer is common for the plurality of the pressure chambers,
wherein the vibration plate includes a first area having a first thickness and a second area having a second thickness,
wherein the first electrode layer, the piezoelectric layer, and the second electrode layer are stacked at the first area,
wherein the second electrode layer is stacked at the second area and the piezoelectric layer and the first electrode layer not stacked at the second area, and
wherein the second thickness is less than the first thickness.
14. The piezoelectric device according to claim 13,
wherein the vibrating plate includes an elastic film and an insulator film, the elastic film has a thickness which is in a range of 300 to 2000 nm, a difference between the first thickness and the second thickness is equal to or more than 10 nm, a thickness of the insulator film at the first thickness is equal to or less than 600 nm, and a thickness of the insulator film at the thickness second thickness is equal to or more than 30 nm.

15. The piezoelectric device according to claim 13, wherein a distance from an outer end portion of the first electrode layer on one side in the first direction to an outer end portion of the piezoelectric layer on the one side is in range of 2.5 to 8.0 µm.

16. A liquid ejecting apparatus comprising:
the piezoelectric device according to claim 13.

17. A piezoelectric device comprising:
a pressure chamber formation substrate that includes a plurality of pressure chambers;
a vibration plate formed on the pressure chamber formation substrate;
a plurality of piezoelectric elements, wherein each pressure chamber is associated with one of the plurality of piezoelectric elements, each piezoelectric element including a first electrode layer, a piezoelectric layer, and a second electrode layer;
wherein the first electrode layer is provided independently for each pressure chamber and the second electrode layer is common for the plurality of the pressure chambers,
wherein the vibration plate includes a first area having a first thickness and a second area having a second thickness,
wherein the piezoelectric layer and the second electrode layer but not the first electrode layer are not stacked at the first area,
wherein the second electrode layer is stacked at the second area and the piezoelectric layer and the first electrode layer not stacked at the second area, and
wherein the second thickness is less than the first thickness.

18. The piezoelectric device according to claim 17,
wherein the vibrating plate includes an elastic film and an insulator film,
the elastic film has a thickness which is in a range of 300 to 2000 nm,
a difference between the first thickness and the second thickness is equal to or more than 10 nm,
a thickness of the insulator film at the second thickness is equal to or more than 30 nm.

19. The piezoelectric device according to claim 17,
wherein a distance from an outer end portion of the first electrode layer on one side in the first direction to an outer end portion of the piezoelectric layer on the one side is in range of 2.5 to 8.0 µm.

20. A liquid ejecting apparatus comprising:
the piezoelectric device according to claim 17.

21. A piezoelectric device comprising:
a pressure chamber formation substrate in which a plurality of spaces is formed, wherein the plurality of spaces are arranged in a first direction; and
a piezoelectric element that includes a first electrode layer, a piezoelectric layer, and a second electrode layer that are stacked in order on a vibrating plate that covers the pressure chamber formation substrate so as to block the plurality of spaces,
wherein:

the first electrode layer is provided independently for each pressure chamber and the second electrode layer is provided continuously for the plurality of the pressure chambers, the vibrating plate, at the area corresponding to the pressure chamber, includes an area P1, and an area P2, the area P1 corresponding to an area on which an activation portion of the piezoelectric layer is stacked, and the area P2 corresponding to an area on which an inactivation portion of the piezoelectric layer is stacked, and when a thickness of the vibrating plate at the area P1 has t1, and a thickness of the vibrating plate at the area P2 has t2, the following expression is satisfied, $t1>t2$.

22. The piezoelectric device according to claim 21,
wherein the vibrating plate includes silicon oxide and zirconium oxide stacked in order from a pressure chamber side, and the thickness of the zirconium oxide is caused to vary in order to satisfy the expression $t1>t2$.

23. The piezoelectric device according to claim 21, wherein a difference between the thickness t1 and the thickness t2 is equal to or more than 10 nm.

24. The piezoelectric device according to claim 21,
wherein the vibrating plate includes an elastic film and an insulator film,
the elastic film has a thickness which is in a range of 300 to 2000 nm,
the thickness of the insulator film at the thickness t1 is equal to or less than 600 nm.

25. The piezoelectric device according to claim 21,
wherein a distance from an outer end portion of the first electrode layer on one side in the first direction to an outer end portion of the piezoelectric layer on the one side is in range of 2.5 to 8.0 µm.

26. A liquid ejecting apparatus comprising:
the piezoelectric device according to claim 21.

27. A piezoelectric device comprising:
a pressure chamber formation substrate that includes a plurality of pressure chambers;
a vibration plate formed on the pressure chamber formation substrate;
a plurality of piezoelectric elements, wherein each pressure chamber is associated with one of the plurality of piezoelectric elements, each piezoelectric element including a first electrode layer, a piezoelectric layer, and a second electrode layer;
wherein the first electrode layer is provided independently for each pressure chamber and the second electrode layer is common for the plurality of the pressure chambers,
wherein the vibration plate includes a first area having a first thickness and a second area having a second thickness,
wherein the first electrode layer, the piezoelectric layer, and the second electrode layer are stacked at the first area, wherein the piezoelectric layer and the second electrode layer but not the first electrode layer are not stacked at the second area, and wherein the second thickness is less than the first thickness.

28. The piezoelectric device according to claim 27,
wherein the vibrating plate includes an elastic film and an insulator film,
the elastic film has a thickness which is in a range of 300 to 2000 nm, the thickness of the insulator film at the thickness t1 is equal to or less than 600 nm.

29. The piezoelectric device according to claim 27, wherein a distance from an outer end portion of the first electrode layer on one side in the first direction to an outer end portion of the piezoelectric layer on the one side is in range of 2.5 to 8.0 µm.

30. A liquid ejecting apparatus comprising:
the piezoelectric device according to claim 27.

* * * * *